US010873341B2

(12) United States Patent
Guo et al.

(10) Patent No.: US 10,873,341 B2
(45) Date of Patent: Dec. 22, 2020

(54) CAPACITOR ARRAY, SUCCESSIVE APPROXIMATION REGISTER ANALOG-TO-DIGITAL CONVERTER AND CAPACITOR ARRAY BOARD

(71) Applicant: Radiawave Technologies Co., Ltd., Shenzhen (CN)

(72) Inventors: Xiaofeng Guo, Shenzhen (CN); Haigang Feng, Shenzhen (CN); Jon Sweat Duster, Beaverton, OR (US); Yulin Tan, Shenzhen (CN); Ning Zhang, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/628,977

(22) PCT Filed: Sep. 19, 2018

(86) PCT No.: PCT/CN2018/106387
§ 371 (c)(1),
(2) Date: Jan. 6, 2020

(87) PCT Pub. No.: WO2019/057052
PCT Pub. Date: Mar. 28, 2019

(65) Prior Publication Data
US 2020/0162096 A1 May 21, 2020

(30) Foreign Application Priority Data

Sep. 20, 2017 (CN) .......................... 2017 1 0862579

(51) Int. Cl.
*H03M 1/38* (2006.01)
*H03M 1/46* (2006.01)

(52) U.S. Cl.
CPC ................................ *H03M 1/466* (2013.01)

(58) Field of Classification Search
CPC .......... H03M 1/466; H03M 1/46; H03M 1/12; H03M 1/00; H03M 1/802; H03M 1/804; H03M 1/806
(Continued)

(56) References Cited

U.S. PATENT DOCUMENTS 7,199,746 B1* 4/2007 Chowdhury .......... H03M 1/468
341/118
7,986,181 B2* 7/2011 Confalonieri ............ H03H 1/02
327/553
(Continued)

FOREIGN PATENT DOCUMENTS

CN 101478309 A 7/2009
CN 103905049 A 7/2014
(Continued)

OTHER PUBLICATIONS

First Office Action in counterpart Chinese application 201710862579. 6, dated Mar. 29, 2018.
(Continued)

*Primary Examiner* — Jean B Jeanglaude
(74) *Attorney, Agent, or Firm* — Westbridge IP LLC

(57) ABSTRACT

The present disclosure relates to a capacitor array for an analog-to-digital converter, a successive approximation register analog-to-digital converter and a capacitor array board. The capacitor array includes a control logic generation circuit, a control code logic conversion circuit, a first sub-capacitor array and a second sub-capacitor array configured to form different regions of a high-order bit region and a low-order bit region. In the present disclosure, the capacitances of the second capacitor units are equal, so that the second capacitor units can be sequentially switched. Thus, no matter which bit in the second binary code changes, it will not cause a large number of the second capacitor units to switch together, thereby reducing conversion error. In (Continued)

addition, the capacitor array is divided in regions, which avoids the problem of a large number of parallel branches in case where only the second sub-capacitor array is arranged.

20 Claims, 2 Drawing Sheets

(58) Field of Classification Search
USPC .................................. 341/156, 155, 161, 172
See application file for complete search history.

(56) References Cited

U.S. PATENT DOCUMENTS

| | | | | |
|---|---|---|---|---|
| 8,786,484 B2* | 7/2014 | Cheong | ................... | H03M 1/12 |
| | | | | 341/172 |
| 9,325,332 B2* | 4/2016 | Ainspan | ................... | H03B 1/00 |
| 9,344,105 B2* | 5/2016 | Li | ....................... | H03M 1/0675 |
| 9,608,656 B2* | 3/2017 | Yuan | ................... | H03M 1/1245 |
| 9,966,967 B2* | 5/2018 | Xu | ....................... | H03M 1/0809 |
| 2013/0106629 A1* | 5/2013 | Nys | ....................... | H03M 1/144 |
| | | | | 341/110 |
| 2014/0035772 A1* | 2/2014 | Tsai | ....................... | H03M 1/12 |
| | | | | 341/172 |

FOREIGN PATENT DOCUMENTS

| | | |
|---|---|---|
| CN | 104604142 A | 5/2015 |
| CN | 104796148 A | 7/2015 |
| CN | 105978565 A | 9/2016 |
| CN | 107565969 A | 1/2018 |

OTHER PUBLICATIONS

International Search Report in corresponding PCT application PCT/CN2018/106387, dated Nov. 28, 2018.

* cited by examiner

| Mapping relationship | |
|---|---|
| Binary code | Thermometer code |
| M4M3M2M1M0 | S30, S29, S28, ...S2, S1, S0 |
| 00000 | 000, ..., 000 |
| 00001 | 000, ..., 001 |
| 00010 | 000, ..., 011 |
| 00011 | 000, ..., 111 |
| ... | ... |
| 11101 | 001, ..., 111 |
| 11110 | 011, ..., 111 |
| 11111 | 111, ..., 111 |
FIG. 3
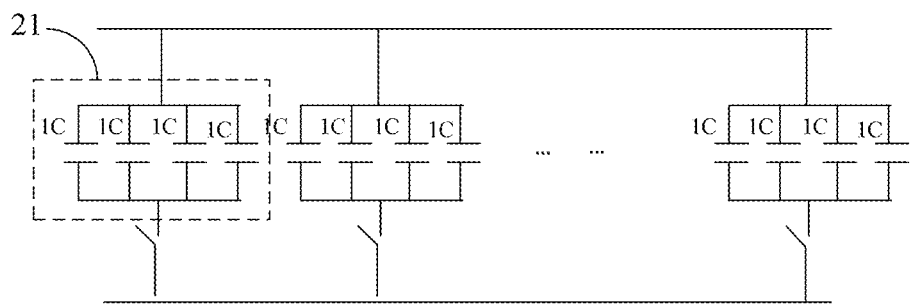
FIG. 4
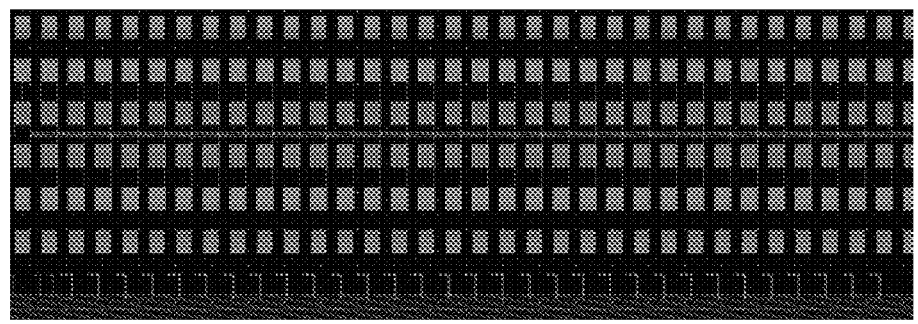
FIG. 5

CAPACITOR ARRAY, SUCCESSIVE APPROXIMATION REGISTER ANALOG-TO-DIGITAL CONVERTER AND CAPACITOR ARRAY BOARD

CROSS-REFERENCE TO RELATED APPLICATION

The present application is a National Stage of International Application No. PCT/CN2018/106387, filed on Sep. 19, 2018, which claims the benefit of Chinese Patent Application No. 201710862579.6, filed on Sep. 20, 2017 with the State Intellectual Property Office of China and entitled "CAPACITOR ARRAY, SUCCESSIVE APPROXIMATION REGISTER ANALOG-TO-DIGITAL CONVERTER AND CAPACITOR ARRAY BOARD", the entirety of which is hereby incorporated herein by reference.

FIELD

The present disclosure relates to the field of semiconductor integrated circuits, and more particularly relates to a capacitor array, a successive approximation register analog-to-digital converter and a capacitor array board.

BACKGROUND

A successive approximation register analog-to-digital converter is abbreviated as SAR ADC. The SAR ADC is currently a most mainstream low-power ADC, in which an important module is a digital-to-analog converter capacitor array (CDAC). The SAR ADC, as an important component between an analog module and a digital module, is widely used in mobile devices, wireless sensors and the like. The ADC is required for a small size and low power consumption, such that it can be easily integrated in circuits of various devices. Limited by manufacturing process, mismatch and error of the CDAC are inversely proportional to the area of the CDAC, which leads to mutual constraints between conversion accuracy and conversion speed of the SAR ADC, and also is a major factor undermining the performance of the SAR ADC. In particular with the process dimension of 28 nm, the mismatch and error become more serious, which will take engineers a lot of effort to reduce the impact on the performance of the ADC.

Specifically, the A-D conversion consists of four steps: sampling, holding, quantization, and coding, among which the quantization is performed by the CDAC. Herein an example is given to facilitate understanding, the least significant bit (LSB) in a digital code corresponds to an analog signal of 1 mV, and 0 mV corresponds to 00000, that is, 1 mV corresponds to 00001, 2 mV corresponds to 00010, 3 mV corresponds to 00011 . . . , 16 mV corresponds to 10000, and 31 mV corresponds to 11111. If an abscissa is the analog signal XX mV, and an ordinate is the digital code YYYYY, a line connecting the points corresponding to each abscissa and ordinate represents the linearity.

The influence of the CDAC on the conversion accuracy of the SAR ADC is as follows: when a binary control code jumps from 0111111 to 100000 or from 00111111 to 01000000, only the least significant bit (LSB) is incremented, but a large number ($2^N$, N depending on the number of changed bits) of unit capacitances are switched. Similarly, when the binary control code jumps from 0111111 to 1000000 or from X011111 to X100000, also a large number of unit capacitances are switched (specifically, when the binary control code jumps from 0111111 to 1000000, 127 unit capacitances are switched; when the binary control code jumps from X011111 to X100000, 63 unit capacitances are switched). The more unit capacitances are switched, the more errors will be introduced. Accordingly, this results in a non-linear conversion, thereby affecting the conversion accuracy of the SAR ADC.

Currently, there include two manners for reducing the mismatch and error of the CDAC. One is to rely on an experienced engineer to design an excellent layout, which, however, cannot essentially reduce the influence of the process error on the ADC conversion accuracy. The other is to use a digital back end to calibrate the non-linearity after measuring the mismatch and error, which, however, is complicated to implement and requires a lot of digital circuits, as well as hard to ensure the measurement accuracy.

SUMMARY

It is an object of the present disclosure to provide a capacitor array for an analog-to-digital converter, a successive approximation register analog-to-digital converter and a capacitor array board, aiming to improve conversion accuracy of the analog-to-digital converter.

In one aspect, the present disclosure provides a capacitor array for an analog-to-digital converter, including a control logic generation circuit, a control code logic conversion circuit, a first sub-capacitor array and a second sub-capacitor array that are configured to form different regions of a high-order bit region and a low-order bit region;

the first sub-capacitor array includes a plurality of first capacitor units and a plurality of first switches, the plurality of first capacitor units are sequentially arranged according to binary weighted capacitances from a least significant bit to a most significant bit, the plurality of first capacitor units are connected in parallel; each of the plurality of first capacitor units is connected to the control logic generation circuit via one of the plurality of first switches; the control logic generation circuit is configured to output a first binary code corresponding to the first sub-capacitor array to the plurality of first switches, to control switching states of the plurality of first switches;

the second sub-capacitor array includes a plurality of second capacitor units arranged in parallel and a plurality of second switches, each of the plurality of second capacitor units is connected to the control code logic conversion circuit via one of the plurality of second switches; the control code logic conversion circuit is connected to the control logic generation circuit; capacitances of the plurality of second capacitor units are equal;

the control logic generation circuit is configured to output a second binary code corresponding to the second sub-capacitor array; the control code logic conversion circuit is configured to convert the second binary code to a thermometer code, and output the thermometer code to the plurality of second switches, to control switching states of the plurality of second switches.

Optionally, the first sub-capacitor array is configured for the low-order bit region; the second sub-capacitor array is configured for the high-order bit region; and a capacitance of the second capacitor unit at a least significant bit in the high-order bit region is twice as a maximum value of capacitances of the first capacitor units.

Optionally, the first sub-capacitor array and the second sub-capacitor array are connected in parallel; a binary code corresponding to the plurality of first capacitor units and the plurality of second capacitor units includes M bits, and a sum of capacitances of the plurality of first capacitor units and the plurality of second capacitor units is $2^M-1$ times the unit capacitance; the number of the plurality of first capacitor units is N, and a sum of capacitances of the plurality of first capacitor units is $2^N-1$ times the unit capacitance; and the number of the plurality of second capacitor units is $2^{M-N}-1$, and a sum of capacitances of the second capacitor units is $2^M-2^N$ times the unit capacitance.

In some embodiments, the number of the plurality of second capacitor units is 15, 31, or 63.

Optionally, the first sub-capacitor array includes two first capacitor units, and the second sub-capacitor array includes thirty one second capacitor units.

In still another aspect, the present disclosure provides a successive approximation register analog-to-digital converter including a comparator, a register connected to an output end of the comparator, and a capacitor array for an analog-to-digital converter.

The capacitor array is connected to an input end of the comparator.

Optionally, a digital signal output by the successive approximation register analog-to-digital converter includes twelve bits; the twelve bits includes seven high-order bits and five low-order bits; and a capacitor array corresponding to the seven high-order bits is the capacitor array for the analog-to-digital converter.

In still another aspect, the present disclosure provides a capacitor array board. A second sub-capacitor array in a capacitor array for an analog-to-digital converter is arranged on the capacitor array board.

The capacitor array board includes a substrate, a plurality of second capacitor units of the second sub-capacitor array are arranged on the substrate along a horizontal direction; each of the plurality of second capacitor units includes a first capacitor, a second capacitor, a third capacitor, and a fourth capacitor, wherein the first capacitor, the second capacitor, the third capacitor, and the fourth capacitor are connected in parallel and each has a unit capacitance.

The upper plates of the first capacitors in the plurality of second capacitor units are connected in series, a plurality of second switches in the second sub-capacitor array are in one-to-one correspondence with the plurality of second capacitor units. The lower plates of the first capacitor, the second capacitor, the third capacitor, and the fourth capacitor in each of the plurality of second capacitor units are connected to the corresponding second switch.

Optionally, the first capacitor, the second capacitor, the third capacitor, and the fourth capacitor in each of the second capacitor units are arranged with the corresponding second switch along a straight line; and the plurality of second capacitor units are arranged on the substrate in parallel.

In accordance with the present disclosure, the second sub-capacitor array is provided, and the capacitances of the plurality of second capacitor units are all equal; the control code logic conversion circuit outputs the thermometer code to control the corresponding states of the second switches. As such, no matter which bit in the thermometer code changes, it will not cause a large number of the second capacitor units to switch together, thereby reducing the conversion error. In addition, the capacitor array is divided in regions, the capacitances of the first capacitor units in the first sub-capacitor array are binary weighted, which avoids the problem of a large number of parallel branches in case where only the second sub-capacitor array is arranged. Compared with the related art, the present disclosure can effectively reduce the conversion error of the capacitor array under the premise that the ADC outputs a same number of bits, thereby improving the conversion accuracy of the ADC.

BRIEF DESCRIPTION OF THE DRAWINGS

In order to illustrate the technical solution in the embodiments of the present disclosure or the prior art more clearly, brief description would be made below to the drawings required in the embodiments of the present disclosure or the prior art. Obviously, the drawings in the following description are merely some of the embodiments of the present disclosure, and those skilled in the art could obtain other drawings according to the structures shown in the drawings without any creative efforts.

FIG. 3 is a schematic diagram illustrating a mapping relationship between a 5-bit second binary code and a thermometer code;

FIG. 4 is a circuit connection diagram of a capacitor array board according to an embodiment of the present disclosure;

FIG. 5 is a physical simulation diagram of the capacitor array board shown in FIG. 4.

EXPLANATION OF REFERENCE NUMERAL

TABLE 1

Figure 1:
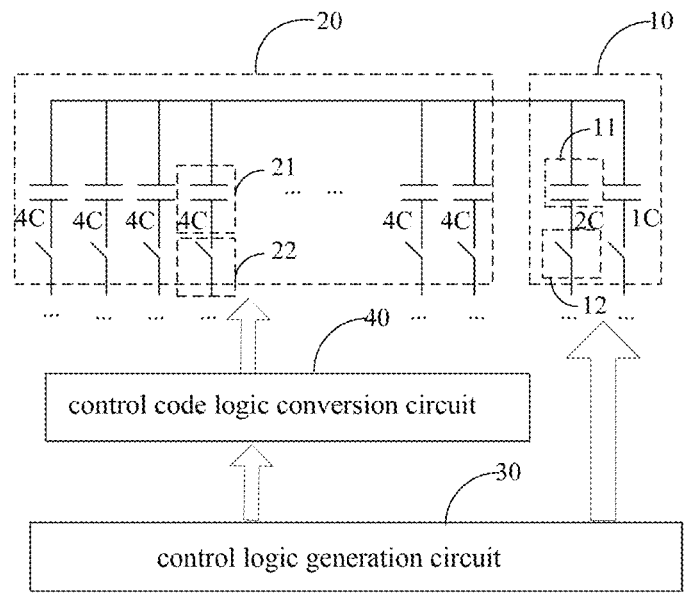
FIG. 1 is a block diagram of a capacitor array for an analog-to-digital converter according to an embodiment of the present disclosure.

| Reference numeral | Name |
| --- | --- |
| 10 | first sub-capacitor array |
| 11 | first capacitor unit |
| 12 | first switch |
| 20 | second sub-capacitor array |
| 21 | second capacitor unit |
| 22 | first switch |
| 30 | control logic generation circuit |
| 40 | control code logic conversion circuit |

The realizing of the aim, functional characteristics and advantages of the present disclosure are further described in detail with reference to the accompanying drawings and the embodiments.

DETAILED DESCRIPTION OF THE EMBODIMENTS

The technical solutions in the embodiments of the present disclosure will be described clearly and completely combining the drawings in the embodiments of the present disclosure. Obviously, the described embodiments are only a part of the embodiments of the present disclosure, but not all of them. Based on the embodiments in the present disclosure, all other embodiments obtained by those skilled in the art without creative work shall belong to the protection scope of the present disclosure.

It should be understand that, all directional indications (such as "upper", "lower", "left", "right", "front", "back" . . . ) in the embodiments of the present disclosure are only used to explain the relative positional relationship, motion, and the like, between components in a certain posture. If the particular posture changes, the directional indication changes accordingly.

In addition, terms such as "first" and "second" are used herein for purposes of description and are not intended to indicate or imply relative importance or to imply the number of indicated technical features. Thus, the features defined with "first" and "second" may comprise or imply at least one of these features. In the description of the present disclosure, "a plurality of" means two or more than two, unless specified otherwise.

The present disclosure provides a capacitor array for an ADC, applied to a SAR ADC. The ADC plays a key role in halving a reference voltage. The capacitive ADC is widely used due to its low noise and high accuracy. In the existing ADC, the capacitor array has binary weighted values, that is, the capacitance of a high-order bit is twice as the capacitance of an adjacent lower-order bit. Thus, when a binary code jumps from 0111111 to 1000000 or from 0011111 to 0100000, only the LSB is incremented, but a large number ($2^N-1$, N depending on the number of changed bits) of unit capacitances are switched. Accordingly, the present disclosure provides a simple and effective solution to eliminate switching error of the capacitor array caused by process deviation. By re-coding the control code of the capacitor array, no matter which bit in the control code of the CDAC changes, only one corresponding unit capacitance is switched, thereby improving conversion error.

Through the switching of the capacitor array for the ADC, a digital code is corresponded to an analog signal. Herein, the corresponding relationship between the digital code and the switching of the capacitor array is described by using an example of a binary weighted capacitor array. Taking a 5-bit binary code XXXXX for example, the capacitor array includes five parallel branches, and the capacitances of the five parallel branches are binary weighted. The left-most bit controls the switching of sixteen unit capacitances, and the right-most bit controls the switching of one unit capacitance. In addition, numbers 0 and 1 indicate whether the corresponding unit capacitance or unit capacitances are switched. If the digital code is 10000, it indicates that the sixteen unit capacitances controlled by the right-most bit are switched, while the other unit capacitances are not switched. If the digital code is 01111, it indicates that the sixteen unit capacitances controlled by the right-most bit are switched, while the other (8+4+2+1) unit capacitances are switched.

Please refer to FIG. 1, the capacitor array provided in the present disclosure includes a control logic generation circuit 30, a control code logic conversion circuit 40, a first sub-capacitor array 10 and a second sub-capacitor array 20 for different regions of a high-order bit region and a low-order bit region. The first sub-capacitor array 10 includes a plurality of first capacitor units 11 and a plurality of first switches 12. The plurality of first capacitor units 11 are sequentially arranged according to binary weighted capacitances from a least significant bit to a most significant bit, and the plurality of first capacitor units 11 are connected in parallel. Each of the first capacitor units 11 is connected to the control logic generation circuit 30 via one of the first switches 12. The control logic generation circuit 30 is configured to output a first binary code corresponding to the first sub-capacitor array 10 to the first switches 12, so as to control the switching states of the first switches 12. The second sub-capacitor array 20 includes a plurality of second capacitor units 21 arranged in parallel and a plurality of second switches 22. Each of the second capacitor units 21 is connected to the control code logic conversion circuit 40 via one of the second switches 22. The control code logic conversion circuit 40 is connected to the control logic generation circuit 30. The capacitances of the second capacitor units 21 are all equal. The control logic generation circuit 30 is also configured to output a second binary code corresponding to the second sub-capacitor array 20. The control code logic conversion circuit 40 is configured to convert the second binary code to a thermometer code, and output the thermometer code to the second switches 22, so as to control the switching states of the second switches 22. By this, no matter which bit in the thermometer code changes, only the corresponding second capacitor unit 21 is switched.

It will be appreciated that the switching of the second capacitor unit 21 refers to that in response to switching the on/off state of the second switch 22 corresponding to the second capacitor unit 21, the lower plate of the second capacitor unit 21 is connected to an analog signal input end or a reference signal input end, causing a state change of the second capacitor unit 21. Herein, the state change of the second capacitor unit 21 is referred to as the switching of the second capacitor unit 21. Similarly, the switching of the first capacitor unit 11 applies a same process, which is not detailed herein.

In an embodiment, the upper plates of all the capacitors in the first sub-capacitor array 10 and the second sub-capacitor array 20 are connected to the comparator through a control switch. The lower plates of the first capacitor units 11 in the first sub-capacitor array 10 are connected to the reference voltage or the ground via the first switches 12. It will be appreciated that the 0 or 1 representing the on or off state of the first switch 12 is relative and this will not affect the conversion result. Similarly, the lower plates of the second capacitor units 21 in the second sub-capacitor array 20 are connected to the reference voltage, the analog signal input end, or the ground via the second switches 22. The control logic generation circuit 30 is configured to control the states of the first switches 12 and the second switches 22, so as to redistribute charge in the capacitor array.

In the first sub-capacitor array 10, the first switch 12 controls the switching of the first capacitor unit 11 connected thereto. For example, suppose that the first sub-capacitor array 10 includes five parallel branches, the five parallel branches each includes one first switch 12 and one first capacitor unit 11. When the control logic generation circuit 30 outputs the first binary code and some bit in the first binary code is 1, it indicates that the state of the first switch 12 corresponding to this bit changes, and accordingly the first capacitor unit 11 connected to this first switch 12 is switched. Because the capacitances of the first capacitor units 11 are binary weighted, each of the first capacitor units 11 has a different weighted value. That is, the states of the first switches 12 are switched in accordance with the incrementing manner of the first binary code.

In the second sub-capacitor array 20, the second switch 22 controls the switching of the second capacitor unit 21 connected thereto. For example, suppose that the second sub-capacitor array 20 includes five parallel branches, the five parallel branches each includes one second switch 22 and one second capacitor unit 21. When the control code logic conversion circuit 40 outputs the thermometer code and some bit in the thermometer code is 1, it indicates that the state of the second switch 22 corresponding to this bit changes, and accordingly the second capacitor unit 21 connected to this second switch 22 is switched. Because the capacitances of the second capacitor units 21 are equal, each of the second capacitor units 21 has a same weighted value. As such, each time the second binary code output by the control logic generation circuit 30 is incremented by one, the corresponding bit in the thermometer code output by the control code logic conversion circuit 40 is set to 1, such that the second capacitor unit 21 in the second sub-capacitor array 20 is sequentially switched. By this, no matter which bit in the second binary code changes, it will not cause a larger number of the second capacitor units 21 to switch together.

Figure 2:
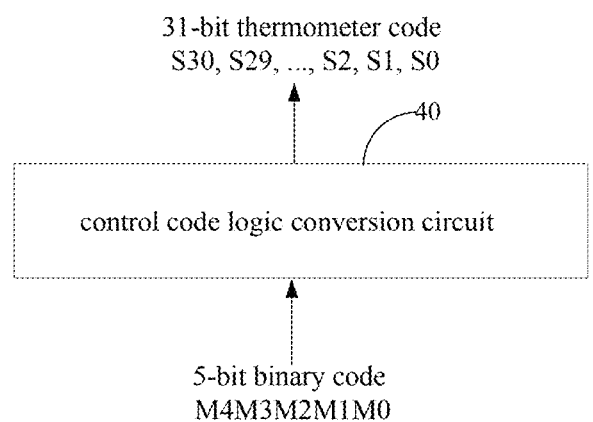
FIG. 2 is a conversion diagram of the control code logic conversion circuit shown in FIG. 1.

Please refer to FIG. 2, according to the above embodiments, the first sub-capacitor array 10 and the second sub-capacitor array 20 have different capacitor arrangements. The first sub-capacitor array 10 is controlled by the first binary code, and the second sub-capacitor array 20 is controlled by the thermometer code. In order to improve compatibility of the capacitor array, to allow the capacitor array provided in the present disclosure to adapt for the existing control logic generation circuit 30 using the binary control code, the capacitor array provided herein includes the control code logic conversion circuit 40. By this, after the control logic generation circuit outputs the second binary code for controlling the second sub-capacitor array 20, the control code logic conversion circuit 40 can convert the second binary code to the thermometer code, so as to control the second sub-capacitor array 20.

FIG. 3 is a schematic diagram illustrating a mapping relationship between a 5-bit second binary code and a thermometer code, in which, from the high-order bit to the low-order bit, the 5-bit second binary code contains M4, M3, M3, M2, and M1, respectively. The 5-bit binary code can represent 31 (16+8+4+2+1=31) different numeric values, thus the corresponding thermometer code contains 31 bits, and the number the second capacitor units 21 in the second sub-capacitor array 20 is 31. From the high-order bit to the low-order bit, the 31-bit thermometer code contains S30, S29, S28, S27, . . . , S0, respectively. It can be understood from FIG. 3 that each time the thermometer code is incremented by one, only one control bit changes. That is, only one second switch 22 is switched, and accordingly only one second capacitor unit 21 is switched.

It should be noted that the second capacitor units 21 in the second sub-capacitor array are sequentially switched from the least significant bit to the most significant bit. Taking the 5-bit binary code for example, when the binary code jumps from 00000 to 00001, the second capacitor unit 21 at the one least significant bit is switched; when the binary code jumps from 00000 to 00010, the second capacitor units 21 at the two least significant bits are switched . . . ; when the binary code jumps from 00000 to 10000, the second capacitor units 21 at the sixteen least significant bits are switched; and when the binary code jumps from 00000 to 10001, the second capacitor units 21 at the seventeen least significant bits are switched.

In this embodiment, the second sub-capacitor array 20 is provided, the capacitances of the second capacitor units 21 in the second sub-capacitor array 20 are all equal, and the control code logic conversion circuit 40 outputs the thermometer code, so as to control the switching state of the corresponding second switch 22. By this, no matter which bit in the thermometer code changes, it will not cause a large number of the second capacitor units 21 to switch together, thereby reducing the conversion error. In addition, considering the large number of the parallel branches in the second sub-capacitor array 20, the capacitor array provided in the present disclosure is divided in regions. In specific, the capacitances of the first capacitor units 11 are binary weighted, such that the number of the parallel branches is less than the number of the parallel branches in case of only using the second sub-capacitor array 20. Compared with the related art, the present solution can effectively reduce the conversion error of the capacitor array under the premise that the ADC outputs a same number of bits, thereby improving the conversion accuracy of the ADC.

In this present disclosure, based on the above embodiments, by properly setting the number of the second capacitor units 21, the conversion accuracy of the ADC and the number of the parallel branches in the capacitor array can be better balanced. Optionally, the number of the second capacitor units 21 is 31, 15, or 63; the corresponding thermometer code contains 31, 15, or 63 bits, respectively; and the corresponding second binary code output by the control logic generation circuit 30 contains 5, 4, or 6 bits, respectively.

During the operation of the capacitor array, noise mainly occurs on the high-order bits. That is, noise margin is multiplied from the high order bit to the low order bit. In the present disclosure, for the purpose of reducing interference of the noise on the capacitor array, the first sub-capacitor array 10 is arranged to correspond to the low-order bits, and the second sub-capacitor array 20 is arranged to correspond to the high-order bits, such that in response to incrementing the thermometer code, only one second capacitor unit 21 is switched. By arranging the second sub-capacitor array 20 to correspond to the high-order bits, the number of the capacitors switched at each time can be reduced, thereby suppressing the noise interference. Further, since the first sub-capacitor array 10 is adjacent to the second sub-capacitor array 20, the capacitance of the second capacitor unit 21 at the least significant bit is twice as the maximum value of the capacitances of the first capacitor units 11.

The first sub-capacitor array 10 and the second sub-capacitor array 20 are arranged in parallel. The first sub-capacitor array 10 and the second sub-capacitor array 20 correspond to a binary code of M bits. The sum of the capacitances of the first capacitor units and the second capacitor units is $2^{M-1}$ times the unit capacitance. The number of the first capacitor units is N, and the total capacitances of the first capacitor units is $2^{N-1}$ times the unit capacitance. The number of the second capacitor units is $2^{M-N}-1$, and the total capacitances of the second capacitor units is $2^M-2^N$ times the unit capacitance. Taking M=7 and N=2 for example, the sum of the capacitances of the first capacitor units and the second capacitor units is $2^7-1=127$ times the unit capacitance; the sum of the capacitances of the first capacitor units is $2^2-1=3$ times the unit capacitance; the number of the second capacitor units is $2^{'2}-1=31$, and the sum of the capacitances of the second capacitor units is $2^7-2^2=124$ times the unit capacitance.

Generally, a high-precision SAR ADC contains 12 bits, and the capacitor array in the 12-bit SAR ADC is typically arranged in a seven-plus-five structure, where seven represents seven high-order bits, and five represents five low-order bits. The capacitor array may also be in a six-plus-six structure or an eight-plus-four structure. In actual operation, the SAR ADC of the seven-plus-five structure is preferable. The accuracy of the ADC is mainly determined by the seven high-order bits, but the accuracy of the seven high-order bits of the existing ADC is not ideal, which greatly limits the performance of the ADC. In an embodiment, a capacitor array corresponding to a digital code (binary) of the seven high-order bits output by the SAR ADC of the seven-plus-five structure uses the capacitor array for the ADC provided in the present disclosure. In specific, the second sub-capacitor array 20 is arranged to correspond to the five high-order bits in the seven high-order bits, and the first sub-capacitor array 10 is arranged to correspond to the two low-order bits in the seven high-order bits. Therefore, from the least significant bit to the most significant bit, the capacitances of the first capacitor units 11 in the first sub-capacitor array 10 are the unit capacitance and two times the unit capacitance, respectively. In addition, since the 5-bit binary code can represent 31 different numeric values (16+8+4+2+1=31), the number of the second capacitor units 21 in the second sub-capacitor array 20 has a total of 31, and each of the capacitances of the second capacitor units 21 is four times the unit capacitance.

The present disclosure also provides a SAR ADC. The SAR ADC includes a comparator, a register connected to an output end of the comparator, and a capacitor array for an analog-to-digital converter. The capacitor array is connected to an input end of the comparator.

This embodiment describes a general work process of the SAR ADC as follows. First, an analog input signal is sampled and held, and then sent to one end of the comparator. Then, the control logic generation circuit 30 presets the most significant bit of the register to 1, and the other bits of the register to 0. The ADC outputs, under the control of the reference voltage and the register, a voltage half of the reference voltage to the other end of the comparator. If the voltage of the analog input signal is greater than one-half of the reference voltage, the comparator outputs 1, and the most significant bit of the register is determined to be 1; if the voltage of the analog input signal is less than one-half of the reference voltage, the comparator outputs 0, and the most significant bit of the register is determined to be 0. By this, the most significant bit of the SAR ADC is determined. After this, the second most significant bit is to be determined. That is, the control logic generation circuit 30 presets the second most significant bit of the register to 1. If the most significant bit is determined to be 1 in the previous conversion cycle, the ADC outputs a voltage three-quarters of the reference voltage. The voltage of the analog input signal is compared with the three-quarters of the reference voltage, so as to determine the second most significant bit of the register. If the most significant bit is determined to be 0 in the previous conversion cycle, the ADC outputs a voltage one-quarter of the reference voltage. The voltage of the analog input signal is compared with one-quarter of the reference voltage, so as to determine the second most significant bit of the register. And so on, until the least significant bit of the register is determined, the value of the register is a final output of the SAR ADC.

Please refer to FIG. 4, the present disclosure also provides a capacitor array board. The capacitor array board is provided with the second sub-capacitor array 20 thereon. The capacitor array board includes a substrate, and a plurality of second capacitor units 21 of the second sub-capacitor array 20 are sequentially arranged on the substrate along a lateral direction. Each of the second capacitor units 21 includes four capacitors of a first capacitor, a second capacitor, a third capacitor, and a fourth capacitor; the four capacitors are sequentially connected in series along a longitudinal direction and each has one unit capacitance. In addition, the upper plates of the first capacitors in the second capacitor units 21 are connected in series. The second switches 22 in the second sub-capacitor array 20 are arranged in a one-to-one correspondence with the second capacitor units 21. The lower plates of the first capacitor, the second capacitor, the third capacitor, and the fourth capacitor are electrically connected to the corresponding second switch 22. Optionally, the first capacitor, the second capacitor, the third capacitor, and the fourth capacitor in each of the second capacitor units 21 are arranged along a straight line with the corresponding second switch 22. The plurality of the second capacitor units 21 are arranged on the substrate in parallel.

Please refer to FIG. 5, FIG. 5 is a physical simulation diagram of the capacitor array board shown in FIG. 4. There are at least 31 columns of capacitor groups shown in FIG. 4, and the middle four capacitors in each column are connected in parallel to form the second capacitor unit 21. Each column of the capacitor groups corresponds to one switch. It will be appreciated that by using the capacitor array provided in the present disclosure, a simple-structured switch control network can replace the complicated layout of the capacitor array in the existing ADC. In the present disclosure, due to the simple wirings between the capacitors on the capacitor array board, the parasitic capacitance of the wirings can be greatly reduced, thereby further improving the conversion accuracy of the ADC.

The foregoing description merely portrays some illustrative embodiments in accordance with the disclosure and therefore is not intended to limit the patentable scope of the disclosure. Any equivalent structure or flow transformations that are made taking advantage of the specification and accompanying drawings of the disclosure and any direct or indirect applications thereof in other related technical fields shall all fall in the scope of protection of the disclosure.

What is claimed is:

1. A capacitor array for an analog-to-digital converter, comprising a control logic generation circuit, a control code logic conversion circuit, a first sub-capacitor array and a second sub-capacitor array that are configured to form different regions of a high-order bit region and a low-order bit region; wherein:

the first sub-capacitor array comprises a plurality of first capacitor units and a plurality of first switches, the plurality of first capacitor units are sequentially arranged according to binary weighted capacitances from a least significant bit to a most significant bit, the plurality of first capacitor units are connected in parallel; each of the plurality of first capacitor units is connected to the control logic generation circuit via one of the plurality of first switches; the control logic generation circuit is configured to output a first binary code corresponding to the first sub-capacitor array to the plurality of first switches, to control switching states of the plurality of first switches;

the second sub-capacitor array comprises a plurality of second capacitor units arranged in parallel and a plurality of second switches, each of the plurality of second capacitor units is connected to the control code logic conversion circuit via one of the plurality of second switches; the control code logic conversion circuit is connected to the control logic generation circuit; capacitances of the plurality of second capacitor units are equal;

the control logic generation circuit is configured to output a second binary code corresponding to the second sub-capacitor array; the control code logic conversion circuit is configured to convert the second binary code to a thermometer code, and output the thermometer code to the plurality of second switches, to control switching states of the plurality of second switches.

2. The capacitor array according to claim 1, wherein:
the first sub-capacitor array is configured as a capacitor array for the low-order bit region;
the second sub-capacitor array is configured as a capacitor array for the high-order bit region; and
a capacitance of the second capacitor unit at a least significant bit in the high-order bit region is twice as a maximum value of capacitances of the first capacitor units.

3. The capacitor array according to claim 2, wherein:
the first sub-capacitor array and the second sub-capacitor array are connected in parallel;
a binary code corresponding to the plurality of first capacitor units and the plurality of second capacitor units comprises M bits, and a sum of capacitances of the plurality of first capacitor units and the plurality of second capacitor units is $2^M-1$ times the unit capacitance;

the number of the plurality of first capacitor units is N, and a sum of capacitances of the plurality of first capacitor units is $2^N-1$ times the unit capacitance; and the number of the plurality of second capacitor units is $2^{M-N}-1$, and a sum of capacitances of the second capacitor units is $2^M-2^N$ times the unit capacitance.

4. The capacitor array according to claim 1, wherein the number of the plurality of second capacitor units is 15, 31, or 63.

5. The capacitor array according to claim 3, wherein the first sub-capacitor array comprises two of the plurality of first capacitor units, and the second sub-capacitor array comprises thirty-one of the plurality of second capacitor units.

6. A successive approximation register analog-to-digital converter, comprising a comparator, a register connected to an output end of the comparator, and a capacitor array for an analog-to-digital converter according to claim 1; wherein, the capacitor array for the analog-to-digital converter is connected to an input end of the comparator.

7. A successive approximation register analog-to-digital converter, comprising a comparator, a register connected to an output end of the comparator, and a capacitor array for an analog-to-digital converter according to claim 2; wherein, the capacitor array for the analog-to-digital converter is connected to an input end of the comparator.

8. A successive approximation register analog-to-digital converter, comprising a comparator, a register connected to an output end of the comparator, and a capacitor array for an analog-to-digital converter according to claim 3; wherein, the capacitor array for the analog-to-digital converter is connected to an input end of the comparator.

9. A successive approximation register analog-to-digital converter, comprising a comparator, a register connected to an output end of the comparator, and a capacitor array for an analog-to-digital converter according to claim 4; wherein, the capacitor array for the analog-to-digital converter is connected to an input end of the comparator.

10. A successive approximation register analog-to-digital converter, comprising a comparator, a register connected to an output end of the comparator, and a capacitor array for an analog-to-digital converter according to claim 5; wherein, the capacitor array for the analog-to-digital converter is connected to an input end of the comparator.

11. The successive approximation register analog-to-digital converter according to claim 6, wherein a digital signal output by the successive approximation register analog-to-digital converter comprises twelve bits; wherein:
the twelve bits comprises seven high-order bits and five low-order bits; and
a capacitor array corresponding to the seven high-order bits is the capacitor array for the analog-to-digital converter.

12. The successive approximation register analog-to-digital converter according to claim 7, wherein a digital signal output by the successive approximation register analog-to-digital converter comprises twelve bits; wherein:
the twelve bits comprises seven high-order bits and five low-order bits; and
a capacitor array corresponding to the seven high-order bits is the capacitor array for the analog-to-digital converter.

13. The successive approximation register analog-to-digital converter according to claim 8, wherein a digital signal output by the successive approximation register analog-to-digital converter comprises twelve bits; wherein:
the twelve bits comprises seven high-order bits and five low-order bits; and
a capacitor array corresponding to the seven high-order bits is the capacitor array for the analog-to-digital converter.

14. The successive approximation register analog-to-digital converter according to claim 9, wherein a digital signal output by the successive approximation register analog-to-digital converter comprises twelve bits; wherein:
the twelve bits comprises seven high-order bits and five low-order bits; and
a capacitor array corresponding to the seven high-order bits is the capacitor array for the analog-to-digital converter.

15. The successive approximation register analog-to-digital converter according to claim 10, wherein a digital signal output by the successive approximation register analog-to-digital converter comprises twelve bits; wherein:
the twelve bits comprises seven high-order bits and five low-order bits; and
a capacitor array corresponding to the seven high-order bits is the capacitor array for the analog-to-digital converter.

16. A capacitor array board, wherein:
a second sub-capacitor array in a capacitor array for an analog-to-digital converter according to claim 1 is arranged on the capacitor array board;
the capacitor array board comprises a substrate, a plurality of second capacitor units of the second sub-capacitor array are arranged on the substrate along a horizontal direction;
each of the plurality of second capacitor units comprises a first capacitor, a second capacitor, a third capacitor, and a fourth capacitor, wherein the first capacitor, the second capacitor, the third capacitor, and the fourth capacitor are connected in parallel and each has a unit capacitance;
upper plates of the capacitors in the plurality of second capacitor units are connected in series, a plurality of second switches in the second sub-capacitor array are in a one-to-one correspondence with the plurality of second capacitor units, and lower plates of the first capacitor, the second capacitor, the third capacitor, and the fourth capacitor in each of the plurality of second capacitor units are connected to the corresponding second switch.

17. The capacitor array board according to claim 16, wherein:
the first capacitor, the second capacitor, the third capacitor, and the fourth capacitor in each of the second capacitor units are arranged with the corresponding second switch along a straight line; and
the plurality of second capacitor units are arranged on the substrate in parallel.

18. The capacitor array board according to claim 16, wherein:
the first sub-capacitor array is configured as a capacitor array for the low-order bit region;
the second sub-capacitor array is configured as a capacitor array for the high-order bit region; and a capacitance of the second capacitor unit at a least significant bit in the high-order bit region is twice as a maximum value of capacitances of the first capacitor units.

19. The capacitor array board according to claim 18, wherein:

the first sub-capacitor array and the second sub-capacitor array are connected in parallel;

a binary code corresponding to the plurality of first capacitor units and the plurality of second capacitor units comprises M bits, and a sum of capacitances of the plurality of first capacitor units and the plurality of second capacitor units is $2^M-1$ times the unit capacitance;

the number of the plurality of first capacitor units is N, and a sum of capacitances of the plurality of first capacitor units is $2^N-1$ times the unit capacitance; and the number of the plurality of second capacitor units is $2^{M-N}-1$, and a sum of capacitances of the second capacitor units is $2^M-2^N$ times the unit capacitance.

20. The capacitor array board according to claim 16, wherein the number of the second capacitor units is 15, 31, or 63.

* * * * *

UNITED STATES PATENT AND TRADEMARK OFFICE
CERTIFICATE OF CORRECTION

Page 1 of 1

PATENT NO. : 10,873,341 B2
APPLICATION NO. : 16/628977
DATED : December 22, 2020
INVENTOR(S) : Xiaofeng Guo et al.

It is certified that error appears in the above-identified patent and that said Letters Patent is hereby corrected as shown below:

In the Specification

In Column 4, Line 35, delete "first switch", insert --second switch--

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*